US008811156B1

(12) United States Patent
Jiang et al.

(10) Patent No.: US 8,811,156 B1
(45) Date of Patent: Aug. 19, 2014

(54) COMPRESSING N-DIMENSIONAL DATA

(75) Inventors: Qin Jiang, Woodland Hills, CA (US); Troy D Rockwood, Thousand Oaks, CA (US)

(73) Assignee: Raytheon Company, Waltham, MA (US)

( * ) Notice: Subject to any disclaimer, the term of this patent is extended or adjusted under 35 U.S.C. 154(b) by 1444 days.

(21) Appl. No.: 11/559,786

(22) Filed: Nov. 14, 2006

(51) Int. Cl.
*G06F 19/24* (2011.01)
*G06F 19/26* (2011.01)

(52) U.S. Cl.
USPC ........................................................ 370/225

(58) Field of Classification Search
USPC .......................................... 713/200; 382/240
See application file for complete search history.

(56) References Cited

U.S. PATENT DOCUMENTS

| | | | | |
|---|---|---|---|---|
| 579,399 | A * | 3/1897 | Wright, Jr | 431/103 |
| 5,020,411 | A | 6/1991 | Rowan | 89/1.11 |
| 5,341,229 | A | 8/1994 | Rowan | 359/10 |
| 5,432,871 | A | 7/1995 | Novik | 382/232 |
| 5,805,801 | A | 9/1998 | Holloway et al. | 395/187.01 |
| 5,991,881 | A | 11/1999 | Conklin et al. | 726/22 |
| 6,088,804 | A | 7/2000 | Hill et al. | |
| 6,226,589 | B1 | 5/2001 | Maeda et al. | 701/207 |
| 6,253,337 | B1 | 6/2001 | Maloney et al. | 714/38 |
| 6,327,550 | B1 | 12/2001 | Vinberg et al. | 702/186 |
| 6,341,298 | B1 * | 1/2002 | Ilani | 708/520 |
| 6,347,263 | B1 | 2/2002 | Johnson et al. | 701/14 |
| 6,404,380 | B2 | 6/2002 | Poore, Jr. | 342/96 |
| 6,408,297 | B1 | 6/2002 | Ohashi | 707/10 |
| 6,421,467 | B1 * | 7/2002 | Mitra | 382/240 |
| 6,574,378 | B1 * | 6/2003 | Lim | 382/305 |
| 6,633,882 | B1 * | 10/2003 | Fayyad et al. | 707/101 |
| 6,650,779 | B2 * | 11/2003 | Vachtesvanos et al. | 382/228 |
| 6,665,715 | B1 | 12/2003 | Houri | 709/223 |
| 6,674,911 | B1 * | 1/2004 | Pearlman et al. | 382/240 |
| 6,744,396 | B2 | 6/2004 | Stone et al. | 342/36 |
| 6,954,775 | B1 | 10/2005 | Shanklin et al. | 718/105 |
| 7,017,186 | B2 * | 3/2006 | Day | 726/23 |
| 7,058,976 | B1 | 6/2006 | Dark | 726/23 |
| 7,100,204 | B1 | 8/2006 | Myllymaki et al. | 726/22 |
| 7,127,743 | B1 | 10/2006 | Khanolkar et al. | 726/23 |
| 7,130,611 | B2 | 10/2006 | Kimura et al. | 455/404.2 |
| 7,146,421 | B2 | 12/2006 | Syvanne | 709/226 |
| 7,185,368 | B2 | 2/2007 | Copeland, III | 726/25 |
| 7,251,376 | B2 * | 7/2007 | Qian et al. | 382/253 |

(Continued)

OTHER PUBLICATIONS

USPTO; Office Action for U.S. Appl. No. 11/176,436, filed Jul. 6, 2005 in the name of Troy Dean Rockwood; 29 pages, Feb. 10, 2009.

(Continued)

*Primary Examiner* — Asad Nawaz
*Assistant Examiner* — Jason Harley
(74) *Attorney, Agent, or Firm* — Schwegman, Lundberg & Woessner, P.A.

(57) ABSTRACT

In certain embodiments, a method for compressing n-dimensional data includes applying a data clustering algorithm to n-dimensional data to partition the n-dimensional data into one or more clusters. Each of the one or more clusters includes a cluster center and a cluster membership. The cluster membership includes an index of one or more cluster members of the cluster. The method further includes performing, for each of the one or more clusters, a subspace projection technique to generate, for each of the cluster members of the cluster, one or more projection coefficients for the cluster member.

16 Claims, 3 Drawing Sheets

(56) References Cited

U.S. PATENT DOCUMENTS

| | | | |
|---|---|---|---|
| 7,324,108 B2 | 1/2008 | Hild et al. | 345/440 |
| 7,370,358 B2 | 5/2008 | Ghanea-Hercock | 726/23 |
| 7,565,346 B2* | 7/2009 | Fan et al. | 1/1 |
| 2002/0059164 A1 | 5/2002 | Shtivelman | 707/1 |
| 2002/0078381 A1 | 6/2002 | Farley et al. | 713/201 |
| 2002/0112189 A1 | 8/2002 | Syvanne et al. | 726/12 |
| 2002/0131497 A1* | 9/2002 | Jang | 375/240.11 |
| 2002/0165842 A1 | 11/2002 | Hellerstein et al. | 706/47 |
| 2002/0188618 A1 | 12/2002 | Ma et al. | |
| 2003/0009699 A1 | 1/2003 | Gupta et al. | 713/201 |
| 2003/0023876 A1 | 1/2003 | Bardsley et al. | 713/201 |
| 2003/0058339 A1 | 3/2003 | Trajkovic et al. | 348/155 |
| 2003/0105976 A1 | 6/2003 | Copeland, III | 726/4 |
| 2003/0145226 A1 | 7/2003 | Bruton et al. | 726/22 |
| 2003/0154399 A1 | 8/2003 | Zuk et al. | 726/11 |
| 2003/0177383 A1 | 9/2003 | Ofek et al. | 726/14 |
| 2003/0188189 A1 | 10/2003 | Desai et al. | 713/201 |
| 2003/0200236 A1* | 10/2003 | Hong | 708/200 |
| 2003/0217289 A1 | 11/2003 | Ammon et al. | 713/201 |
| 2004/0015719 A1 | 1/2004 | Lee et al. | 726/23 |
| 2004/0024855 A1 | 2/2004 | Tsai et al. | 709/223 |
| 2004/0025044 A1 | 2/2004 | Day | 726/22 |
| 2004/0044912 A1 | 3/2004 | Connary et al. | 713/201 |
| 2004/0049698 A1 | 3/2004 | Ott et al. | 713/201 |
| 2004/0098623 A1 | 5/2004 | Scheidell | 713/201 |
| 2004/0103211 A1 | 5/2004 | Jackson et al. | 709/244 |
| 2004/0107125 A1 | 6/2004 | Guheen et al. | 705/7 |
| 2004/0117407 A1 | 6/2004 | Kumar et al. | 707/200 |
| 2004/0117654 A1 | 6/2004 | Feldman et al. | 713/201 |
| 2004/0133543 A1 | 7/2004 | Shlaes et al. | 707/1 |
| 2004/0172557 A1 | 9/2004 | Nakae et al. | 726/22 |
| 2004/0193943 A1 | 9/2004 | Angelino et al. | 714/4 |
| 2004/0215977 A1 | 10/2004 | Goodman et al. | 726/13 |
| 2004/0260945 A1 | 12/2004 | Raikar et al. | 713/201 |
| 2004/0261116 A1 | 12/2004 | Mckeown et al. | 725/109 |
| 2004/0267786 A1 | 12/2004 | Malik | 709/206 |
| 2005/0035965 A1* | 2/2005 | Sloan et al. | 345/426 |
| 2005/0044406 A1 | 2/2005 | Stute | 713/201 |
| 2005/0047670 A1* | 3/2005 | Qian et al. | 382/253 |
| 2005/0108518 A1 | 5/2005 | Pandya | 713/151 |
| 2005/0138110 A1 | 6/2005 | Redlich et al. | 709/201 |
| 2005/0222996 A1 | 10/2005 | Yalamanchi | 707/4 |
| 2005/0254654 A1 | 11/2005 | Rockwell et al. | 380/270 |
| 2006/0010493 A1 | 1/2006 | Piesco et al. | 726/23 |
| 2006/0031934 A1 | 2/2006 | Kriegel | 726/22 |
| 2006/0130070 A1 | 6/2006 | Graf | 719/318 |
| 2006/0209836 A1 | 9/2006 | Ke et al. | 370/392 |
| 2006/0253905 A1 | 11/2006 | Mansel | 726/23 |
| 2006/0253907 A1 | 11/2006 | McConnell | 726/23 |
| 2007/0009160 A1* | 1/2007 | Loo et al. | 382/225 |
| 2007/0064627 A1* | 3/2007 | Campos | 370/255 |

OTHER PUBLICATIONS

Henry S. Teng, et al.; *Security Audit Trail Analysis Using Inductively Generated Predictive Rules*; IEEE; CH2842-3/90/0000/0024; pp. 24-29, 1990.

IEEE *Xplore Release 2.5 Search Results*; 4 pages, retrieved Jan. 6, 2009.

USPTO; Office Action for U.S. Appl. No. 11/219,025, filed Sep. 1, 2005 in the name of Troy Dean Rockwood; 16 pages, Jan. 15, 2009.

N. Hari Narayanan, et al.; *A Methodology for Knowledge Acquisition and Reasoning in Failure Analysis of Systems*; IEEE Transactions on Systems, Man, and Cybernetics; vol. SMC-17, No. 2; pp. 274-288, 1987.

Henry S. Vaccaro; *Detection of Anomalous Computer Session Activity*; IEEE Symposium on Research in Security and Privacy; 24 pages, May 1989.

Henry S. Teng, et al.; *Adaptive Real-Time Anomaly Detection Using Inductively Generated Sequential Patterns*; IEEE; CH2884-5/90/0000/0278; pp. 278-284, 1990.

Keith C. C. Chan, et al.; *Learning Sequential Patterns for Probabilistic Inductive Prediction*; IEEE Transactions on Systems, Man, and Cybernetics; vol. 24, No. 10; 16 pages, Oct. 1994.

F. Girault, et al.; *Linear Logic as a Tool for Reasoning on a Petri Net Model*; IEEE Symposium on Emerging Technologies and Factory Automation; 11 pages, Oct. 1995.

P. Nassery, et al.; *Real Time Seismic Signal Processing Using the ARMA Model Coefficients and an Intelligent Monitoring System*; IEEE TENCON—Speech and Image Technologies for Computing and Telecommunications; pp. 807-810, 1997.

Moataz A. Ahmed, et al.; *Rule-Based Information Distribution Systems: Near-Optimal Rule Sets Generation*; IEEE; 0-7803-4778-1; pp. 1564-1569, 1998.

P. Lang, et al.; *A Graphical Editor for the Conceptual Design of Business Rules*; 1 page, Feb. 1998.

Alistair G. Sutcliffe, et al.; *Supporting Scenario-Based Requirements Engineering*; IEEE Transactions on Software Engineering; vol. 24, No. 12; pp. 1072-1088, Dec. 1998.

Adrian K. Rantilla, et al.; *Aggregation of Expert Opinions*; Proceedings of the 32nd Hawaii International Conference on System Sciences; IEEE 0-7695-0001-3/99; pp. 1-11, 1999.

Slavica Jonic, et al.; *Three Machine Learning Techniques for Automatic Determination of Rules to Control Locomotion*; IEEE Transactions on Biomedical Engineering; vol. 46, No. 3; pp. 300-310, Mar. 1999.

Ian Ho, et al.; *Generating Test Cases for Real-Time Software by Time Petri Nets Model*; Proceedings Eighth Asian Test Symposium; 7 pages, Nov. 1999.

Virtyt Koshi; *Radio Network Planning for Ultra TDD Systems*; First International Conference on 3G Mobile Communication Technologies; 7 pages, Mar. 2000.

Ilham Benyahia, et al.; *An Adaptive Framework for Distributed Complex Applications Development*; Proceedings 34th International Conference on Technology of Object-Oriented Languages and Systems; 12 pages, Jul. 2000.

Tae-Sic Yoo, et al.; *New Results on Decentralized Supervisory Control of Discrete-Event Systems*; 6 pages, Dec. 2000.

Ping-Peng Yuan, et al.; *An Event and Service Interacting Model and Event Detection Based on the Broker/Service Mode*; pp. 20-24. Jul. 2001.

W. E. Brown, et al.; *Estimation of Ocean Bottom Scattering Strength Using Discrete Eigenray Matching in Shallow Water*; MTS 0-933-957-28-9; pp. 1636-1639, Nov. 2001.

XiaoShu Hang, et al.; *A FSA-Based Approach for Mining Sequential Patterns with User-Specified Skeletons*; Proceedings of the 4th World Congress on Intelligent Control and Automation; 6 pages, Jun. 2002.

Azizi Ab Aziz, et al.; *Development of an Adaptive Business Insolvency Classifier Prototype (AVICENA) Using Hybrid Intelligent Algorithms*; Proceedings Globalizing Research and Development in Electrical and Electronics Engineering; 5 pages, Jul. 2002.

Loganathan Lingappan, et al.; *Test Generation for Non-Separable RTL Controller-Datapath Circuits Using a Satisfiability Based Approach*; Proceedings of the 21st International Conference on Computer Design; 7 pages, 2003.

F. Y. Nakamoto, et al.; *Systematization of the Project of the Production System Control*; IEEE International Symposium on Industrial Electronics; 8 pages, Jun. 2003.

Nicholas Pioch, et al.; *CADRE: Continuous Analysis and Discovery From Relational Evidence*; International Conference on Integration of Knowledge Intensive Multi-Agent Systems; 9 pages, Sep. 2003.

Andrew Hamilton-Wright, et al.; *Constructing a Fuzzy Rule Based Classification System Using Pattern Discovery*; NAFIPS 2005—2005 Annual Meeting of the North American Fuzzy Information Processing Society; pp. 460-465, 2005.

USPTO; Office Action for U.S. Appl. No. 10/407,700, filed Apr. 4, 2003 in the name of Jon-Michael C. Brook; 10 pages, Aug. 9, 2006.

USPTO; Office Action for U.S. Appl. No. 10/407,030, filed Apr. 4, 2003 in the name of Jon-Michael C. Brook; 9 pages, Jan. 8, 2007.

USPTO; Office Action for U.S. Appl. No. 10/407,513, filed Apr. 4, 2003 in the name of Jon-Michael C. Brook; 12 pages, Mar. 27, 2007.

USPTO; Office Action for U.S. Appl. No. 10/407,700, filed Apr. 4, 2003 in the name of Jon-Michael C. Brook; 9 pages, Apr. 19, 2007.

USPTO; Office Action for U.S. Appl. No. 11/219,595, filed Sep. 1, 2005 in the name of Troy Dean Rockwood; 17 pages, Jun. 7, 2007.

USPTO; Advisory Action for U.S. Appl. No. 10/407,700, filed Apr. 4, 2003 in the name of Jon-Michael C. Brook; 3 pages, Jul. 6, 2007.

(56) References Cited

OTHER PUBLICATIONS

USPTO; Notice of Allowance and Fee(s) Due for U.S. Appl. No. 10/407,030, filed Apr. 4, 2003 in the name of Jon-Michael C. Brook; 15 pages, Aug. 24, 2007.
USPTO; Notice of Allowance and Fee(s) Due for U.S. Appl. No. 10/407,513, filed Apr. 4, 2003 in name of Jon-Michael C. Brook; 17 pages, Nov. 6, 2007.
USPTO; Notice of Allowance and Fee(s) Due for U.S. Appl. No. 11/219,595, filed Sep. 1, 2005 in the name of Troy Dean Rockwood; 6 pages, Nov. 7, 2007.
USPTO; Office Action for U.S. Appl. No. 11/219,025, filed Sep. 1, 2005 in the name of Troy Dean Rockwood; 11 pages, Mar. 24, 2008.
USPTO; Office Action for U.S. Appl. No. 11/219,025, filed Sep. 1, 2005 in the name of Troy Dean Rockwood; 12 pages, Sep. 10, 2008.
USPTO; Advisory Action for U.S. Appl. No. 11/219,025, filed Sep. 1, 2005 in the name of Troy Dean Rockwood; 3 pages, Nov. 20, 2008.
USPTO; Office Action for U.S. Appl. No. 10/407,700, filed Apr. 4, 2003 in the name of Jon-Michael C. Brook; 7 pages, Apr. 17, 2009.
USPTO; Office Action for U.S. Appl. No. 11/219,291, filed Sep. 1, 2005 in the name of Troy Dean Rockwood; 36 pages, May 20, 2009.
Sheng Ma, et al.; *Event Miner: An Integrated Mining Tool for Scalable Analysis of Event Data*; 17 pages, May 21, 2001.
USPTO; Office Action for U.S. Appl. No. 11/219,291, filed Sep. 1, 2005 in the name of Troy Dean Rockwood; 33 pages, Dec. 11, 2008.
Pending U.S. Appl. No. 10/407,513, entitled *"Vertically Extensible Intrusion Detection System and Method"*, inventors Jon-Michael C. Brook, et al., 44 pages plus 7 pages of drawings, filed Apr. 4, 2003.
Pending U.S. Appl. No. 10/407,700, entitled *"Dynamic Rule Generation for an Enterprise Intrusion Detection System"*, inventors Jon-Michael C. Brook, et al., 38 pages plus 7 pages of drawings, filed Apr. 4, 2003.
Pending U.S. Appl. No. 10/407,030, entitled *"Graphical User Interface for an Enterprise Intrusion Detection System"*, inventors Jon-Michael C. Brook, et al., 34 pages plus 7 pages of drawings, filed Apr. 4, 2003.
Pending U.S. Appl. No. 11/176,436, entitled *"System and Method for Active Data Collection in a Network Security System"*, inventor Troy D. Rockwood, 23 pages plus 2 pages of drawings, filed Jul. 6, 2005.
Pending U.S. Appl. No. 11/219,025, entitled *"System and Method for Interactive Correlation Rule Design in a Network Security System"*, inventor Troy D. Rockwood, 31 pages plus 4 pages of drawings, filed Sep. 1, 2005.
Pending U.S. Appl. 11/219,595, entitled *"System and Method for Intruder Tracking Using Advanced Correlation in a Network Security System"*, inventor Troy D. Rockwood, 43 pages plus 7 pages of drawings, filed Sep. 1, 2005.
Pending U.S. Appl. 11/219,291, entitle *"System and Method for Collaborative Information Security Correlation in Low Bandwidth Environments"*, inventors Troy D. Rockwood, 44 pages plus 7 pages of drawings, filed Sep. 1, 2005.
Allen Gersho, et al., entitled *"Vector Quantization and Signal Compression,"* Academic Publisher, 737 pages, 1992.
Sanjoy Dasgupta; Experiments with Random Projection; Proc. 16th Conference Uncertainty in Artificial Intelligence (UAI), 9 pages, 2000.
A. Arnold, "Kernel Based Anomaly Detection," Intrusion Detection Systems, Machine Learning Group, Columbia University, 2 pages, Apr. 26, 2001.
R. Bace and P. Mell, "NIST Special Publication on Intrusion Detection Systems," 51 pages, Feb. 2001.
C. Boeckman, "Getting Closer to Policy-Based Intrusion Detection." Information Security Bulletin, pp. 13-20, May 2000.
Cisco Systems, Inc., "NetRanger User Guide 2.2.1," Chapters 1-9 and Appendices A-C, 2000.
Commonwealth of Australia, "Handbook 13, Intrusion Detection and Audit Analysis v. 1.0," Australian Communications—Electronic Security Instruction 33 (ACSI 33).

D. Curry, and H. Debar, "Intrusion Detection Message Exchange Format Data Model and Extensible Markup Language (XML) Document Type Definition," Intrusion Detection Working Group, 116 pages, Jan. 2003.
W. Jansen, P. Mell, et al., "Mobile Agents in Intrusion Detection and Response." National Institute for Standards and Technology, 12 pages, Jun. 2000.
Symantec, "Intrusion Detection," 4 pages, 2002.
Intrusion.com, Inc., "Network Intrusion Detection System Product Overview," SecureNet Series, 6 pages, Jul. 2001.
Phung, "Data Mining in Intrusion Detection," Sans.org, 3 pages, Jan. 24, 2000.
R. Power, "CSI Roundtable: Experts discuss present and future intrusion detection systems,." Computer Security Journal vol. XIV, #1, 2001.
R. Raghudharan, "Intrusion Detection Systems: Beyond the first line of defense," Network Magazine, 7 pages, Sep. 2001.
ISS Corporation, "ISS RealSecure © Protection System," 5 pages, Apr. 1, 2003.
Stick, "A Potential Denial of Service Against IDS Systems," Internet Security Systems Security Alert, 2 pages, Mar. 2001.
S. Northcutt, and J. Novak, "Network Intrusion Detection: An Analyst's Handbook," $2^{nd}$ Ed., 18 pages, Sep. 2000.
B. Yocom, K. Brown, and D. Van Derveer, "Intrusion Detection Products Grow Up," Network World, 12 pages, Oct. 2001.
Y.F. Jou, F. Gong, C. Sargor, X Wu, S.F. Wu, H.Y. Chang and F. Wang, "Design and implementation of a scalable intrusion detection system for protection of network infrastructure," DARPA Information Survivability Conference and Exposition (DISCEX), 15 pages, Jan. 2000.
J. Li and G. Eschelbeck, "Multi-Tier Intrusion Detection System," 11 pages.
F. Wang, F. Gong, C. Sargor, K. Goseva-Popstojanova, K. Trivedi and F. Jou, "SITAR: A Scalable Intrusion-Tolerant Architecture for Distributed Services," IEEE Workshop on Information Assurance and Security, pp. 38-45, Jun. 2001.
S.F. Wu, H.C. Chang, F. Jou, F. Wang, F. Gong, C. Sargor, D. Qu and R. Cleaveland, "JiNao: Design and ImpleMentation of a Scalable Intrusion Detection System for the OSPF Routing Protocol," pp. 0-23, Feb. 24, 1999.
Peng Ning, et al.; *Techniques and Tools for Analyzing Intrusion Alerts*; ACM Transactions on Information and System Security; vol. 7, No. 2; 45 pages, May 2004.
Pending U.S. Appl. No. 11/328,689 entitled *System and Method for Attacker Attribution in a Network Security System* in the name of Troy Dean Rockwood; 51 total pages, filed Jan. 10, 2006.
USPTO; Office Action for U.S. Appl. No. 11/328,689, filed Jan. 10, 2006 in the name of Troy Dean Rockwood; 18 pages, Mar. 19, 2009.
USPTO; Office Action for U.S. Appl. No. 11/219,025, filed Sep. 1, 2005 in the name of Troy Dean Rockwood; 12 pages, Jul. 22, 2009.
Troy Dean, USPTO, Office Action for U.S. Appl. No. 11/176,436, filed Jul. 6, 2005, mailed Aug. 7, 2009.
Troy Dean, USPTO, Office Action for U.S. Appl. No. 11/328,689, filed Jan. 10, 2006, mailed Sep. 10, 2009.
USPTO; Office Action for U.S. Appl. No. 11/219,025, filed Sep. 1, 2005 in the name of Troy Dean Rockwood; 12 pages; Jan. 5, 2010.
USPTO; Office Action for U.S. Appl. No. 11/219,291, filed Sep. 1, 2005 in the name of Troy Dean Rockwood; 34 pages; Dec. 11, 2009.
Noel et al., "Correlating Intrusion Events and Building Attack Scenarios Through Attack Graph Distances", 2004, Computer Security Applications Conferences, 2004, 20th Annual, pp. 1-5.
USPTO; Office Action for U.S. Appl. No. 11/176,436, filed Jul. 6, 2005 in the name of Troy Dean Rockwood; 20 pages; Dec. 24, 2009.
USPTO; Office Action for U.S. Appl. No. 10/407,700, filed Apr. 4, 2003 in the name of Joh-Michael Brook; 4 pages; Oct. 16, 2009.
USPTO;Office Action for U.S. Appl. No. 10/407,700, filed Apr. 4, 2003 in the name of Jon-Michael C. Brook; 5 pages, Notification Date Apr. 14, 2010.
USPTO; Office Action for U.S. Appl. No. 11/328,689, filed Jan. 10, 2006 in the name of Troy Dean Rockwood; 25 pages, Notification Date Feb. 22, 2010.

(56) References Cited

OTHER PUBLICATIONS

Liu et al., *"Incremental Maintenance of Nested Relational Views"*, Database Engineering and Applications, 1999, International Symposium Proceedings Aug. 2-4, 1999; pp. 197-205, 1999.

USPTO; Office Action for U.S. Appl. No. 10/219,025, filed Sep. 1, 2005 in the name of Troy Dean Rockwood; 13 pages, Notification Date May 28, 2010.

USPTO, Office Action for U.S. Appl. No. 11/219,291, filed Sep. 1, 2005 in the name of Troy Rockwood, 32 pages, Mailed Dec. 11, 2009.

USPTO; Office Action for U.S. Appl. No. 11/219,025, filed Sep. 1, 2005, Inventor Troy Dean Rockwood; 12 pages; Jan. 5, 2010.

USPTO; Office Action for U.S. Appl. No. 11/328,689, filed Jan. 10, 2006, Inventor Troy Dean Rockwood; 25 pages; Feb. 22, 2010.

USPTO; Office Action for U.S. Appl. No. 10/407,700, filed Apr. 4, 2003 in the name of Jon-Michael C. Brook; 5 pages. Apr. 14, 2010.

USPTO; Office Action for U.S. Appl. No. 10/407,700, filed Apr. 4, 2003 in the name of Jon-Michael C. Brook; 4 pages, Oct. 16, 2009.

USPTO; Final Office Action, U.S. Appl. No. 11/219,025, filed Sep. 1, 2005, Inventor Troy Dean Rockwood; May 28, 2010, 13 pages.

USPTO; Office Action, U.S. Appl. No. 11/219,291, filed Sep. 1, 2005 in the name of Troy Dean Rockwood; 36 pages, Jun. 24, 2010.

USPTO; Advisory Action, U.S. Appl. No. 11/328,689, filed Jan. 10, 2006 in the name of Troy Dean Rockwood; 2 pages, Nov. 30, 2009.

USPTO; Advisory Action, U.S. Appl. No. 11/219,025, filed Sep. 1, 2005, Inventor Troy Dean Rockwood; 4 pages, Aug. 4, 2010.

USPTO; Office Action, U.S. Appl. No. 11/219,291, filed Sep. 1, 2005 in the name of Troy Dean Rockwood; 33 pages, Sep. 14, 2010.

USPTO; Notice of Allowance and Fee(s) Due, U.S. Appl. No. 10/407,700, filed Apr. 4, 2003, Inventor Jon-Michael C. Brook; 9 pages, Oct. 19, 2010.

Rockwood, "Response Pursuant to 37 C.F.R. §1.111," U.S. Appl. No. 11/219,025, 11 pages, filed with USPTO Jun. 24, 2008.

Rockwood, "Response Pursuant to 37 C.F.R. §1.111," U.S. Appl. No. 11/219,025, 16 pages, filed with USPTO Apr. 14, 2009.

Rockwood, "Response Pursuant to 37 C.F.R. §1.111," U.S. Appl. No. 11/328,689, 15 pages, filed with USPTO Jun. 19, 2009.

Rockwood, "Response Pursuant to 37 C.F.R. §1.111," U.S. Appl. No. 11/219,291, 14 pages, filed with USPTO Aug. 20, 2009.

Rockwood, "Response Pursuant to 37 C.F.R. §1.111," U.S. Appl. No. 11/219,025, 11 pages, filed with USPTO Oct. 22, 2009.

Rockwood, "Response Pursuant to 37 C.F.R. §1.116," U.S. Appl. No. 11/328,689, 15 pages, filed with USPTO Nov. 9, 2009.

Rockwood, "Response Pursuant to 37 C.F.R. §1.116," U.S. Appl. No. 11/219,025, 12 pages, filed with USPTO Nov. 10, 2008.

Rockwood, "Response Pursuant to 37 C.F.R. §1.111," U.S. Appl. No. 11/219,291, 13 pages, filed with USPTO Mar. 11, 2010.

Rockwood, "Response Pursuant to 37 C.F.R. §1.111," U.S. Appl. No. 11/219,025, 13 pages, filed with USPTO Apr. 5, 2010.

Rockwood, "Response Pursuant to 37 C.F.R. §1.111," U.S. Appl. No. 11/328,689, 17 pages, filed with USPTO May 24, 2010.

Brook et al., "Response Pursuant to 37 C.F.R. §1.111," U.S. Appl. No. 10/407,700, 12 pages, filed with USPTO Jul. 14, 2010.

Brook et al., "Response Pursuant to 37 C.F.R. §1.111," U.S. Appl. No. 10/407,700, 3 pages, filed with USPTO Jan. 19, 2010.

Rockwood, "Response Pursuant to 37 C.F.R. §1.116," U.S. Appl. No. 11/219,025, 15 pages, filed with USPTO, Jul. 28, 2010.

Rockwood, "Response Pursuant to 37 C.F.R. §1.116," U.S. Appl. No. 11/219,291, 15 pages, filed with USPTO, Aug. 24, 2010.

USPTO; Notice of Allowance and Fee(s) Due; U.S. Appl. No. 11/219,291, filed Sep. 1, 2005, Troy Dean Rockwood; (9 pages), date mailed Jan. 13, 2011.

USPTO; Office Action, U.S. Appl. No. 11/176,436, filed Jul. 6, 2005, Troy Dean Rockwood; (29 pages), notification date Feb. 17, 2011.

* cited by examiner

COMPRESSING N-DIMENSIONAL DATA

TECHNICAL FIELD OF THE INVENTION

This invention relates generally to data compression and more particularly to compressing n-dimensional data.

BACKGROUND

It is often desirable to compress electronic data such as digital data. For example, compression of electronic data may be used to minimize storage capacity requirements for storing the data. As another example, compression of electronic data may be used to minimize bandwidth requirements for transmitting the electronic data over a communication link. As just one particular example, intrusion detection systems may be used by an enterprise to detect and identify unauthorized or unwanted use (commonly called an attack) of the enterprise's computer network, which normally comprises a large number of nodes and network operations centers. Intrusion detection systems often receive voluminous amounts of incoming electronic data. Consequently, it may be desirable to compress intrusion detection data, to minimize bandwidth and storage requirements for example.

SUMMARY

According to the present invention, disadvantages and problems associated with previous techniques for compressing data may be reduced or eliminated.

In certain embodiments, a method for compressing n-dimensional data includes applying a data clustering algorithm to n-dimensional data to partition the n-dimensional data into one or more clusters. Each of the one or more clusters includes a cluster center and a cluster membership. The cluster membership includes an index of one or more cluster members of the cluster. The method further includes performing, for each of the one or more clusters, a subspace projection technique to generate, for each of the cluster members of the cluster, one or more projection coefficients for the cluster member.

Particular embodiments of the present invention may provide one or more technical advantages. In certain embodiments, the present invention provides a technique for compressing n-dimensional data such that the compressed n-dimensional data may be communicated using less bandwidth. For example, the present invention may enable network nodes to compress and transmit n-dimensional data in a low bandwidth network substantially without diminishing the usefulness of the data. In certain embodiments, the compression technique of the present invention attempts to remove unimportant information and then compress the remaining information to fit within the confines of a low bandwidth system.

Certain embodiments of the present invention may enable an intrusion detection system to correlate incoming data received by multiple sensors communicatively connected in a low bandwidth network. For example, the present invention may enable network nodes to compress and transmit intrusion detection data in a low bandwidth network without diminishing the usefulness of the data.

Previous and conventional compression techniques often use generic file compression techniques or stream compression techniques to send information between network nodes. However, the compressed data generally cannot be used in the compressed form, so additional disk or other memory space and processing may be used to reconstruct the data in a usable form. In certain embodiments, the present invention provides a technique for data compression of graphical data. The graphical data may be used directly by nodes to perform correlation.

Certain embodiments of the present invention may provide some, all, or none of the above advantages. Certain embodiments may provide one or more other technical advantages, one or more of which may be readily apparent to those skilled in the art from the figures, descriptions, and claims included herein.

BRIEF DESCRIPTION OF THE DRAWINGS

For a more complete understanding of the present invention and its advantages, reference is made to the following descriptions, taken in conjunction with the accompanying drawings, in which.

DESCRIPTION OF EXAMPLE EMBODIMENTS

Figure 1:
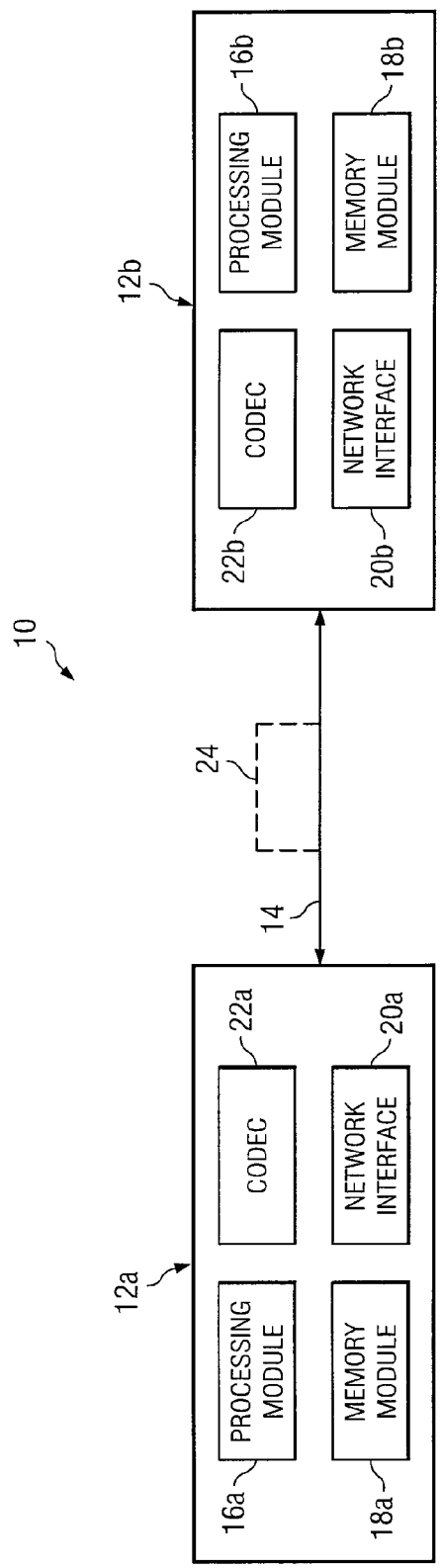
FIG. 1 illustrates an example system for compressing n-dimensional data according to certain embodiments of the present invention.

FIG. 1 illustrates an example system 10 for compressing n-dimensional data according to certain embodiments of the present invention. In the illustrated example, system 10 includes a first node 12a and a second node 12b, each of which may be mobile nodes in a network. Although this particular implementation of system 10 is illustrated and primarily described, the present invention contemplates any suitable implementation of system 10 according to particular needs.

In general, node 12a transmits data, including compressed n-dimensional data, to node 12b over a link 14, and node 12b receives the data and processes it as appropriate. Node 12a and node 12b may be coupled to one another using a link 14 that includes one or more computer buses, one or more wireless ad-hoc networks, one or more local area networks (LANs), one or more metropolitan area networks (MANs), one or more wide area networks (WANs), at least a portion of a global computer network such as the Internet, or one or more other suitable wireline, optical, wireless, or other links. Link 14 may include a military network, a commercial network, a combination of military and commercial networks, or any other suitable network.

Nodes 12 may include any suitable nodes in any suitable type of communication network. Nodes 12 and their associated components may each operate on one or more computer systems at one or more locations. As non-limiting examples, nodes 12 may be mobile nodes within a wireless ad-hoc network or may be mobile nodes within another suitable type of wireless network. Although nodes 12 are described primarily as being separate, nodes 12 may share one or more computer resources or other appropriate resources according to particular needs. Nodes 12a and 12b may or may not be physically remote from one another. Each node 12 may include any suitable components and may be structured in any suitable manner, according to particular needs. In the particular example illustrated in FIG. 1, each node 12 includes a processing module 16 and a memory module 18.

Processing modules 16 may each include one or more processing units, which may include one or more microprocessors, controllers, or any other suitable computing devices or resources. Processing module 16 may work either alone or in combination with other components of node 12 to provide the functionality of node 12. For example, operations performed by processing module 16 may be performed collectively by processing module 16 and memory module 18.

Each memory module 18 may take the form of volatile or non-volatile memory including, without limitation, magnetic media, optical media, random access memory (RAM), read-only memory (ROM), removable media, or any other suitable memory component. In certain embodiments, memory module 18 comprises one or more databases, such as one or more Structured Query Language (SQL) databases or any other suitable types of databases.

Each node 12 may include a suitable network interface 20 for transmitting or receiving data via link 14. As just one example, each network interface 20 may include any suitable combination of one or more transmitters, one or more receivers, or and any other suitable devices for interacting with link 14.

Each node 12 may include an encoder, a decoder, or both (collectively referred to as a "codec"). For purposes of this description, among other possible functions, an encoder may be operable to compress n-dimensional data in accordance with the present invention, a decoder may be operable to decompress n-dimensional data in accordance with the present invention, and a codec may be operable to both compress and decompress n-dimensional data in accordance with the present invention. For ease of description, it will be assumed that both nodes 12a and 12b include a corresponding codec 22 and are thus capable of compressing and decompressing n-dimensional data. It should be understood, however, that the present invention contemplates either of nodes 12 being capable of only compressing or decompressing n-dimensional data, if appropriate. Although codec 22 is primarily described as performing the compression functions of the present invention, the present invention contemplates any suitable component of a node performing the compression functions. Codecs 22 may be implemented using any suitable combination of hardware, firmware, and software.

In certain embodiments, the present invention enables node 12a to compress n-dimensional data for transmission to node 12b. For purposes of this description, it will be assumed that node 12a transmits compressed n-dimensional data and that node 12b receives compressed n-dimensional data; however, this is for example purposes only. N-dimensional data may represent information in a graphical format. For example, n-dimensional data may include data expressed as a list of n-dimensional point coordinates. Each coordinate may have a particular meaning, as will be described in more detail below with respect to a particular example use of the present invention. As a particular non-limiting example of the format of the n-dimensional data, the n-dimensional data may include five-dimensional data, the coordinates being data values in a five-dimensional space such as (1, 5, −30, 0.6, 44) and (−5, 0, 2, 5.43, 0.003).

Node 12a may automatically initiate compression of the n-dimensional data, or the compression may be initiated manually (e.g., in response to a user request). For example, when node 12a attempts to transmit n-dimensional data via link 14, codec 22a may automatically (or in response to a user request) compress the n-dimensional data. Node 12a may communicate the compressed n-dimensional data to node 12b as transmitted data 24 via link 14. For example, network interface 20a of node 12a may facilitate the transmission of transmitted data 24 via link 14. Transmitted data 24 may include n-dimensional data that has been compressed in accordance with the present invention. Transmitted data 24 may have any suitable format, such as one or more packets, one or more cells, or any other suitable transmission format.

In operation of an example embodiment of system 10, codec 22a may receive n-dimensional data. The n-dimensional data may be received by codec 22a for transmission to one or more destinations, such as one or more other nodes 12 (e.g., node 12b). Codec 22a of node 12a may compress the n-dimensional data for transmission via link 14a to node 12b (e.g., as transmitted data 24). In certain embodiments, codec 22a of node 12a is operable to compress the n-dimensional data by applying both lossless and lossy compression to the n-dimensional data. Codec 22a may apply a data clustering algorithm to n-dimensional data to partition the n-dimensional data into one or more clusters (e.g., m clusters). For example, codec 22a may use a Fuzzy C-Mean algorithm to partition the n-dimensional data into the m clusters. In certain embodiments, a genetic algorithm may be used to determine an optimal value for m (i.e., the optimal number of clusters in which to partition the n-dimensional data). This partitioning may be performed dynamically.

Codec 22a may use scalar quantization to compress the cluster centers of each of the one or more clusters. In certain embodiments, scalar quantization provides lossless compression of the cluster centers. Each cluster may have an associated cluster membership. The cluster membership may be an index of the one or more cluster members of the cluster. In certain embodiments, the cluster membership is a set of integers that comprise the indices of the data points of the cluster members. Codec 22a may use a lossless coding to compress the cluster membership.

Codec 22a may perform, for each of the one or more clusters, a subspace projection technique to generate, for each of the cluster members of the cluster, one or more projection coefficients for the cluster member. For example, the subspace projection technique may compress the cluster members of each of the clusters. This may provide a first level of lossy compression for the n-dimensional data. The subspace projection technique may generate, for each of the cluster members of a cluster, one or more projection coefficients. In certain embodiments, a tree-structured quantization may be applied to the compressed cluster members to further compress the n-dimensional data. For example, the tree structured quantization may be performed on the projection coefficients for the cluster members. The tree-structured quantization may provide a second level of lossy compression of the n-dimensional data.

The compressed data may be coded using entropy coding. For example, the quantized cluster centers for each of the clusters, the cluster membership (compressed using lossless coding), and the projection coefficients for the cluster members (or, in embodiments in which tree structured quantization is performed, the quantized projection coefficients of the cluster members) may be encoded using entropy coding. This encoding may allow the compressed n-dimensional data to be transmitted via link 14 (e.g., as transmitted data 24) to one or more destinations, such as one or more other nodes 12 (e.g., node 12b). The coded and compressed n-dimensional data may be communicated to its appropriate one or more destinations. Network interface 20a may facilitate the transmission of the coded and compressed n-dimensional data via link 14 (e.g., as transmitted data 24).

Node 12b may receive transmitted data 24 via link 14. For example, network interface 20b of node 12b may facilitate the receipt of transmitted data 24 via link 14. Codec 22b of node 12b may be operable to decompress the compressed n-dimensional data of transmitted data 24, either manually or autonomously. If appropriate, in order to decode the compressed n-dimensional data of transmitted data 24, codec 22b may reconstruct the members of the clusters using decoded cluster centers and quantized projection coefficients. In certain embodiments, codec 22b of node 12b may accurately reproduce the cluster centers and the cluster membership for the one or more clusters using the quantized cluster centers and the losslessly coded cluster membership. Some distortion may be tolerated in the reconstruction of the actual cluster members. The actual cluster members may be reconstructed using the projection coefficients for the cluster members (which may have been further compressed by codec 22a of node 12a using tree-structured quantization). Although node 12a is primarily described as the sending node 12 and node 12b is primarily described as the receiving node 12, the present invention contemplates either of nodes 12a or 12b sending compressed n-dimensional data and either of nodes 12a or 12b receiving compressed n-dimensional data. In certain embodiments multiple nodes 12 in a network may each send and receive compressed n-dimensional data. Additionally, although a particular number of nodes 12 are illustrated and primarily described with reference to FIG. 1, the present invention contemplates system 10 including any suitable number of nodes according to particular needs, any combination of which may send and/or receive compressed n-dimensional data. Moreover, the present invention contemplates compression of n-dimensional data in accordance with the present invention in any suitable system.

As described above, the compression techniques contemplated by certain embodiments of the present invention may be used with any suitable types of nodes. One example use of the present invention is for intrusion detection. Intrusion detection systems are often used by an enterprise to detect and identify unauthorized or unwanted use (commonly called an attack) of the enterprise's computer network, which normally comprises a large number of nodes and network operations centers. These enterprise intrusion detection systems may receive data using sensors or other intrusion detection devices. The sensors typically transmit the incoming data via an internal network to a server. The server typically correlates the incoming data according to rules designed to detect specific patterns in network traffic, audit trails, and other data sources to detect attacks on the enterprise's computer network. Intrusion detection systems often receive voluminous amounts of incoming data. Consequently, intrusion detection systems typically have required a high bandwidth network connection between the sensors and the server. In addition, intrusion detection systems typically have required that the high bandwidth network connection be dedicated primarily to the transmission of intrusion detection system data. In many cases this data may be sent to a centralized point via a special purpose security network so that this volume will not interfere with "normal" data flows.

In certain embodiments, the present invention provides a technique for compressing intrusion detection data that has been transformed into a graphical representation (e.g., n-dimensional data) so that the compressed intrusion detection data (e.g., n-dimensional data) can be transmitted using a lower bandwidth connection. In certain embodiments, because the intrusion detection data is represented in a graphical format (e.g., in n-dimensional format), the intrusion detection data may be directly used by recipients (e.g., other nodes) without full decompression, decreasing the storage requirements on a recipient node 12 for performing data correlation. An example use of certain embodiments of the present invention is provided in a patent application Ser. No. 11/219,291, entitled "System and Method for Collaborative Information Security Correlation in Low Bandwidth Environments," filed Sep. 1, 2005.

As just one example of n-dimensional data in an intrusion detection system, the n-dimensional data may include three dimensions. The first dimension may include a time at which an event occurred (e.g., the x-axis dimension), the second dimension may include the source Internet Protocol (IP) address (e.g., the y-axis dimension), and the third dimension may include the destination IP address (e.g., the z-axis dimension). Although these three dimensions are described for n-dimensional intrusion detection data, the present invention contemplates n-dimensional intrusion detection data comprising any suitable number and types of dimensions. For example, n-dimensional data for an event in an intrusion detection system may include different or additional dimensions for different or additional attributes of the event. These additional attributes may include, for example, the type of device that generated the event, the payload of the detected event, the type of computer code in the detected event, the day of week of the detected event, or any other suitable attribute of the detected event.

Although intrusion detection data has been primarily described, certain embodiments of the present invention can be applied to any graphically represented data that is transmitted between nodes. In certain embodiments, the present invention may be used with commercial systems such as Security Information Management (SIM) products and personalized intrusion detection and prevention systems.

Particular embodiments of the present invention may provide one or more technical advantages. In certain embodiments, the present invention provides a technique for compressing n-dimensional data such that the compressed n-dimensional data may be communicated using less bandwidth. For example, the present invention may enable network nodes 12 to compress and transmit n-dimensional data in a low bandwidth network substantially without diminishing the usefulness of the data. In certain embodiments, the compression technique of the present invention attempts to remove unimportant information and then compress the remaining information to fit within the confines of a low bandwidth system.

Certain embodiments of the present invention may enable an intrusion detection system to correlate incoming data received by multiple sensors communicatively connected in a low bandwidth network. For example, the present invention may enable network nodes 12 to compress and transmit intrusion detection data in a low bandwidth network without diminishing the usefulness of the data.

Previous and conventional compression techniques often use generic file compression techniques or stream compression techniques to send information between network nodes. However, the compressed data generally cannot be used in the compressed form, so additional disk or other memory space and processing may be used to reconstruct the data in a usable form. In certain embodiments, the present invention provides a technique for data compression of graphical data. The graphical data may be used directly by nodes to perform correlation.

Figure 2:
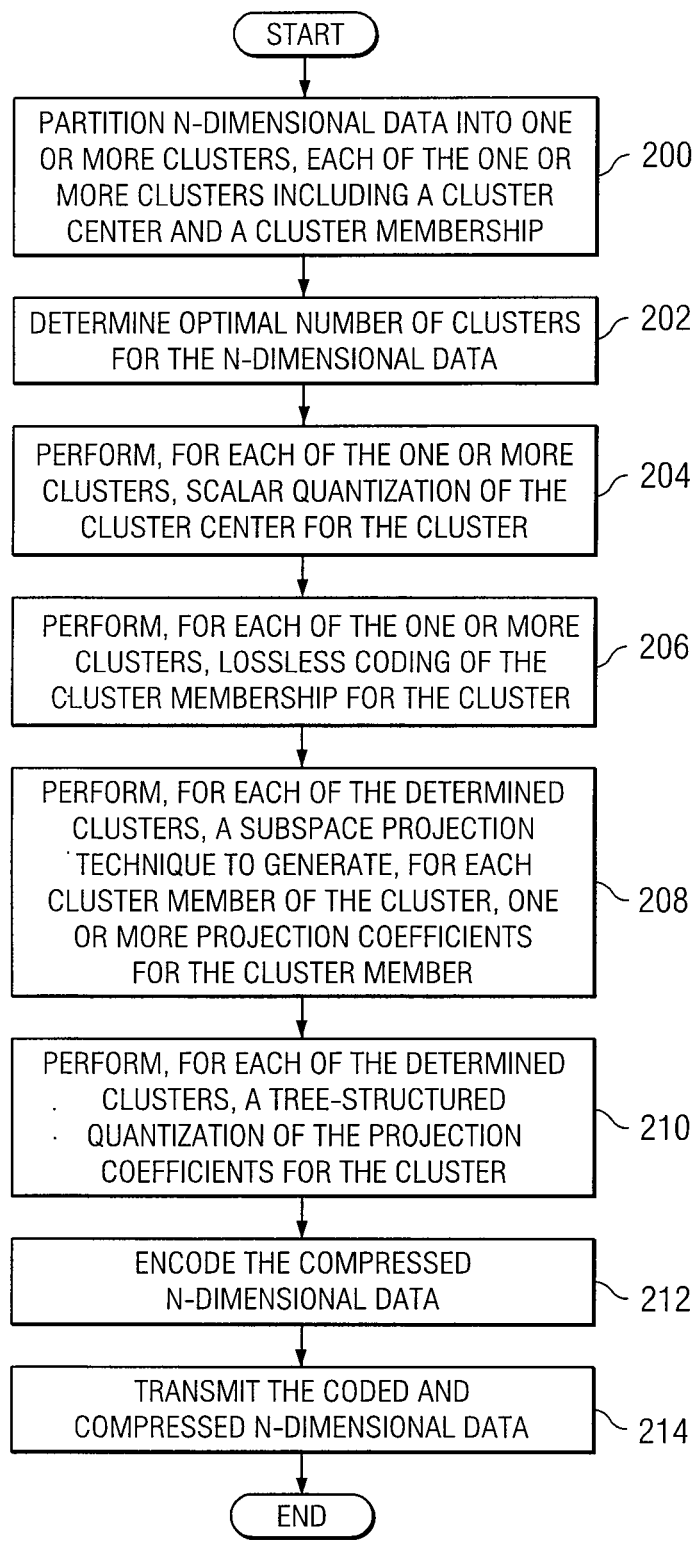
FIG. 2 illustrates an example method for compressing n-dimensional data according to certain embodiments of the present invention.

FIG. 2 illustrates an example method for compressing n-dimensional data according to certain embodiments of the present invention. In certain embodiments, the codec 22 of the sending node 12 (e.g., codec 22a of node 12a) may perform all or a portion of the following steps; however, the present invention contemplates any suitable component of the sending node 12 performing all or a portion of the steps.

At step 200, n-dimensional data may be partitioned into one or more clusters. For example, n-dimensional data may be partitioned into m clusters. In certain embodiments, a Fuzzy C-Mean data clustering technique may be used to partition the n-dimensional data into the one or more clusters. An example algorithm for using the Fuzzy C-Mean technique to partition n-dimensional data into one or more clusters is described below with reference to FIG. 3. In certain embodiments, the n-dimensional data includes intrusion detection data. For example, the n-dimensional data may include data for one or more network events, each dimension of the n-dimensional data for a network event corresponding to an attribute of the event. As just one example, in an embodiment in which n equals three, the first dimension may specify a source IP address, the second dimension may specify an event time (e.g., formatted as hour, minute, and seconds), and the third dimension may specify a destination IP address.

At step 202, an optimal number of clusters for the n-dimensional data may be determined. In certain embodiments, a genetic algorithm may be used to determine the optimal number of clusters for the n-dimensional data based on the quality of the clustering for a particular number of clusters. Thus, the genetic algorithm may be used to determine the optimal value for the variable m.

Certain data partitioning algorithms (e.g., the Fuzzy C-Mean algorithm of step 200) use the number of clusters as an input parameter. However, for incoming n-dimensional data, the optimal number of clusters may be an unknown value, which may be a challenging problem for such data partitioning algorithms. If an appropriate number of partitions (i.e., clusters) is not used, then the resulting partitioning may be undesirable. In certain embodiments, the partitioning of the n-dimensional data into m clusters (step 300) and the determination of the optimal number of clusters (step 302) may be cooperative processes, portions of which may be performed substantially simultaneously. For example, the optimal number of clusters determined using the genetic algorithm (e.g., m) may be an input parameter to the data clustering algorithm (e.g., the Fuzzy C-Mean algorithm). In other words, the genetic algorithm may drive the data clustering algorithm.

The Fuzzy C-Mean algorithm may be used for partitioning the n-dimensional data, and the genetic algorithm may be evaluated to provide the number of clusters to the Fuzzy C-Mean algorithm and to evaluate the quality of the data partitioning determined using the provided number of clusters. For a given data partition, the genetic algorithm may provide a fitness score and the algorithms may interact until the best fitness score is determined. In this way, an optimal data partition can be achieved. An example interaction of the Fuzzy C-Mean algorithm and the genetic algorithm to determine partition n-dimensional data into m clusters (m being the optimal number of clusters) is described in more detail below with reference to FIG. 3.

In certain embodiments, for each of the one or more clusters of the n-dimensional data, the result of the data partitioning of step 200 (in combination with the optimization algorithm of step 202, if appropriate) is a cluster center for the cluster and a cluster membership for the cluster. The cluster membership may also be referred to as a cluster diameter for the cluster. Thus, the result of the data partitioning performed at step 200 (in combination with the optimization algorithm of step 202, if appropriate) may be a set of cluster centers and cluster diameters.

At step 204, for each of the determined clusters of the n-dimensional data, scalar quantization may be performed on the cluster center. In certain embodiments, the scalar quantizer for scalar quantization of the cluster centers may be a uniform quantizer, an optimal quantizer (e.g., the Lloy Quantizer), a differential pulse code modulation (DPCM) quantizer, or any other suitable type of quantizer. The use of scalar quantization (which may be considered high quality or lossless compression) for quantizing the cluster centers may be appropriate or otherwise desirable since there may be fewer cluster centers than there are cluster members. Although scalar quantization is primarily described as the technique for compressing the cluster centers, the present invention contemplates using any other suitable technique for losslessly coding the cluster centers.

At step 206, for each of the determined clusters of the n-dimensional data, lossless coding may be performed on the cluster membership for the cluster. As described above, the cluster membership for a cluster may include an index of the one or more cluster members of the cluster. The index may be a list identifying the cluster members of the cluster, such as a set of integers (i.e., the indices of the data points that are the cluster members). The use of a lossless coding may be considered high quality or lossless compression.

In certain embodiments, it may be desirable for the receiving node 12, which will decode the data, to be able to accurately reconstruct the cluster centers and the cluster memberships. The use of high quality or lossless compression on the cluster centers and the cluster membership may allow the receiving node 12 to accurately reconstruct the cluster centers and the cluster memberships.

At step 208, for each of the determined clusters of the n-dimensional data, a subspace projection technique may be performed to generate, for each cluster member of the cluster, one or more projection coefficients for the cluster member. The subspace projection technique provides a way to compress the parameters of each member of the cluster. In certain embodiments, the subspace projection technique may code (or replace with a key) values from the n-dimensional vector space into values from a discrete subspace of lower dimensions. The lower space vector may use less storage space and/or less bandwidth for transmission.

In general, the subspace projection technique includes determining, for each cluster of the n-dimensional data, one or more basis vectors for the cluster. The basis vectors for a cluster may define the subspace for the cluster. The basis vectors may eliminate one or more of the n dimensions. For example, it may be determined that the values for a dimension for each cluster member are substantially the same, so that particular dimension may not be meaningful (or may be of reduced meaning) in distinguishing the cluster members. As just one example with respect to intrusion detection data, it may be the case that each cluster member of a cluster originates from the same source IP address. In this example, it may be appropriate to eliminate the dimension of the data related to the source IP address or to communicate that information only once rather than for each cluster member.

Each cluster member of the cluster may be associated with a point in the n-dimensional space. In order to compress an individual point (i.e., corresponding to a cluster member) within a cluster, the point may be projected onto the subspace to determine a representation of that point. For each cluster, distances may be approximated to each cluster member, resulting in projection coefficients for each cluster member of the cluster. The subspace projection technique may determine a point in the subspace (which typically comprises fewer dimensions than n dimensions) for each cluster member, the origin of the point in the subspace being the cluster center rather than the true origin of the n-dimensional space. The distance from the cluster center to the cluster member (i.e., in the subspace) may be a smaller number (which can be represented in a smaller manner (e.g., with few bits) using the projection coefficients) than the distance form the true origin of the n-dimensional data to the cluster member, which may provide a level of compression. Two example subspace projection techniques are described below with reference to FIG. 3.

At step 210, for each of the determined clusters of the n-dimensional data, a tree-structured quantization of the projection coefficients for the cluster may be performed. The subspace projection technique of step 208 for generating the projection coefficients for the cluster may provide a first level of compression, applying the tree-structured quantization may further compress the n-dimensional data by compressing the projection coefficients of each of the cluster members of the cluster. Taking the intrusion detection example described above, it may be the case that for the time dimension, only the hour and minute is useful. Thus, it may be determined that data relating to seconds can be eliminated. At this point, the compressed n-dimensional data may include, for each cluster of the n-dimensional data, a quantized cluster center for the cluster, the losslessly coded cluster membership, one or more basis vectors for the cluster, and one or more projection coefficients for the cluster (which may be further compressed using the tree-structured quantization). In certain embodiments, performing the tree-structured quantization (step 210) is optional.

At step 212, the compressed n-dimensional data may be encoded. For example, entropy coding may be performed on the compressed, quantized n-dimensional data. This encoding may format the compressed, quantized n-dimensional data for transmission over link 14. The coded compressed, quantized n-dimensional data may be in binary format. Example techniques for entropy coding include Huffman coding and algorithmic coding. In certain embodiments, because it may be appropriate to recover the cluster membership at the decoder side, it is encoded using entropy coding.

At step 214, the coded and compressed n-dimensional data may be transmitted. For example, in the example system 10, the coded and compressed n-dimensional data may be transmitted as transmitted data 24 via link 14 from node 12a to node 12b.

Although a particular method has been described with reference to FIG. 2, the present invention contemplates any suitable method for compressing n-dimensional data in accordance with the present invention. Thus, certain of the steps described with reference to FIG. 2 may take place substantially simultaneously and/or in different orders than as illustrated and described. Moreover, components of system 10 or other systems may use methods with additional steps, fewer steps, and/or different steps, so long as the methods remain appropriate.

Figure 3:
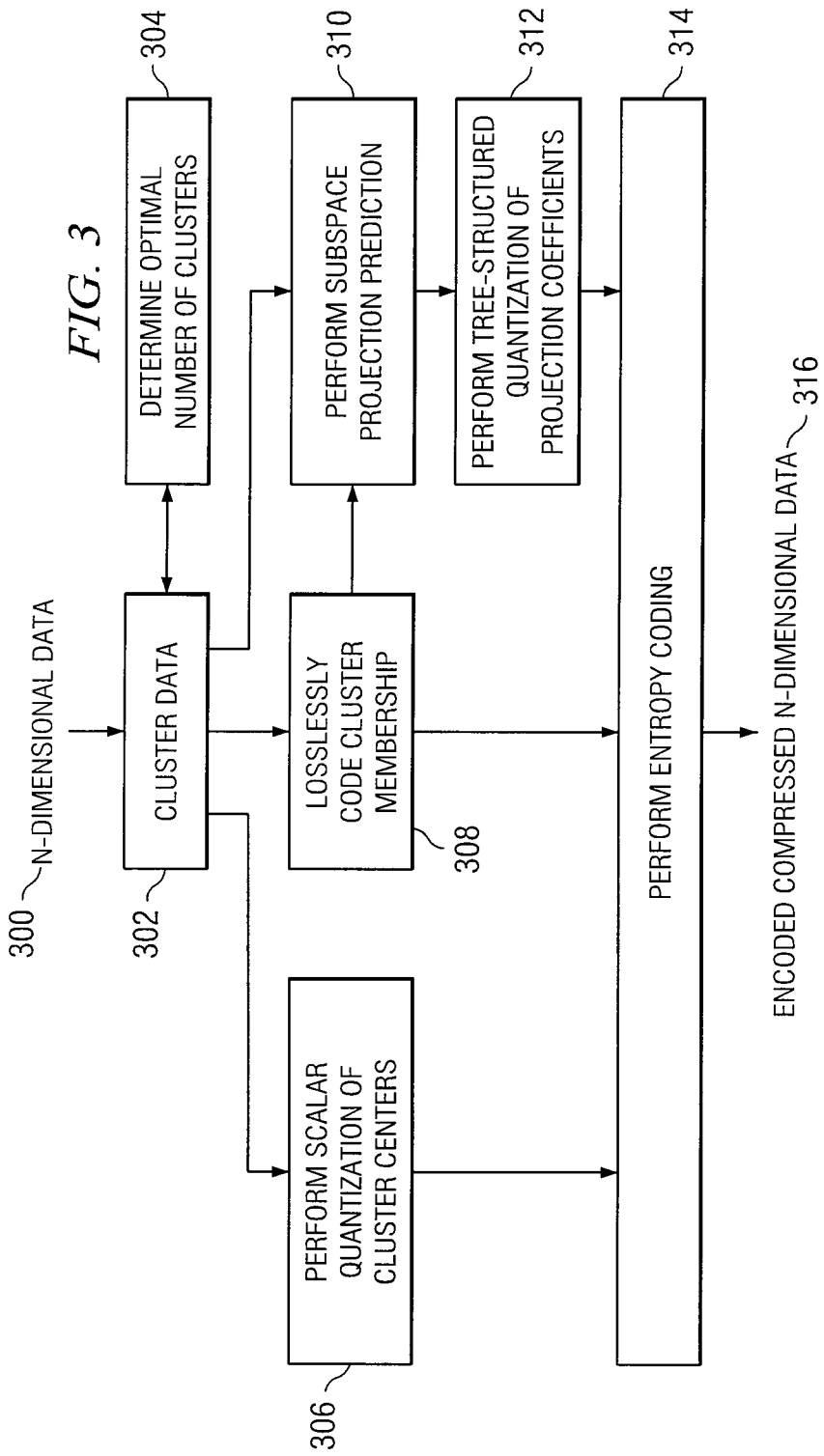
FIG. 3 illustrates an example functional block diagram of a compression algorithm for compressing n-dimensional data according to certain embodiments of the present invention.

FIG. 3 illustrates an example functional block diagram of a compression algorithm for compressing n-dimensional data, according to certain embodiments of the present invention. In certain embodiments, codec 22 of the sending node 12 is operable to perform all or a portion of the algorithm illustrated in FIG. 3; however, the present invention contemplates any suitable component of the sending node 12 performing all or a portion of the algorithm.

N-dimensional data 300 may be received and may represent information (e.g., intrusion detection data) in a graphical format. As an example, n-dimensional data 300 may be received by codec 22a of node 12a for transmission to node 12b via link 14. Codec 12a may determine whether n-dimensional data 300 should be compressed. In certain embodiments, codec 12a does not determine whether n-dimensional data 300 should be compressed. This may occur, for example, if node 12a is configured to always communicate n-dimensional data, such as n-dimensional data 300, in a compressed format.

At block 302, n-dimensional data 300 may be partitioned into one or more clusters. In certain embodiments, a Fuzzy C-Mean data clustering technique may be used to partition n-dimensional data 300 into the one or more clusters. As shown at block 304, the optimal number of clusters into which n-dimensional data 300 should be partitioned may also be determined. As described above with reference to FIG. 2, a genetic algorithm may be used to determine the optimal number of clusters for n-dimensional data 300 based on the quality of the clustering for that number of clusters. In certain embodiments, the partitioning of n-dimensional data 300 into one or more clusters (block 302) and the determination of the optimal number of clusters (block 304) may be cooperative processes, portions of which may be performed substantially simultaneously. For example, the optimal number of clusters determined using the genetic algorithm may be an input (e.g., m) to the data clustering algorithm. In other words, the genetic algorithm may drive the data clustering algorithm (e.g., the Fuzzy C-Mean algorithm).

Partitioning Using a Fuzzy C-Mean Data Clustering Technique

In certain embodiments, the partitioning of n-dimensional data 300 into one or more clusters may be performed according to the following formulas. It should be understood that these formulas are provided merely as examples and should not be used to limit the present invention.

For n-dimensional data 300, which may be represented as $X=\{x_i\}_{i=1}^{N}$, and the number of clusters m, it may be desirable to calculate the centers of clusters, which may be represented as $C=\{c_i\}_{i=1}^{m}$, that minimize the objective function defined by the following formula:

$$J_q(C, U) = \sum_{i=1}^{N} \sum_{j=1}^{m} u_{ij}^q d(x_i, c_j) - \sum_{i=1}^{N} \lambda_i (\sum_{j=1}^{m} u_{ij} - 1),$$

where $d(x_i, c_j)=(x_i-c_j)^T A(x_i-c_j)$, A may be a symmetric and positive definite matrix, and $U=\{u_{ij}\}$ may represent fuzzy membership. The constant q>1 may be a parameter called a fuzzifier, and the variable $\lambda_i$ may be the Lagrangian constant. In certain embodiments, the optimization is achieved through an iterative procedure. For example, the iterative procedure may be as follows:

1. Choose $c_j(0)$ as initial estimate for C
2. Set t=0
3. For i=1 to N
   For j=1 to m $$u_{ij}(t) = \frac{1}{\sum_{k=1}^{m} \left(\frac{d(x_i, c_j)}{d(x_i, c_k)}\right)^{\frac{1}{q-1}}}$$

end
end
t=t+1
For j=1 to m $$c_j(t) = \frac{\sum_{i=1}^{N} u_{ij}^q(t-1)x_i}{\sum_{i=1}^{N} u_{ij}^q(t-1)}$$

end
4. Check $\|C(t)-C(t-1)\| \le \epsilon$
If no, go to step 3.
5. Label the data by the maximal value of the membership. That is:
$x_i \in$ cluster k, if $u_{ik} = \max(u_{ij})_{j=1}^{m}$.

Determining the Optimal Number of Clusters Using a Genetic Algorithm

In certain embodiments, the optimal number of clusters may be determined using a genetic algorithm. To use a genetic algorithm for determining the optimal number of clusters, a fitness function that can provide a measurement of the quality of clustering for given number of clusters may be defined. As just one example, a Fisher discriminant ratio may be used as the fitness function and may be defined by the following equation:

$$f(m) = \frac{1}{2}\sum_{i=1}^{m}\sum_{\substack{j=1 \\ j \ne i}}^{m} \frac{\|c_i - c_j\|^2}{\sigma_i^2 + \sigma_j^2} \text{ with } \sigma_i^2 = \frac{1}{N}\sum_{x_k \in cls_i}\|x_k - c_i\|^2,$$

where $N_i$ is the number of members in the $cls_i$.

The number of clusters (m) may be an integer and may be encoded into a binary chromosome. Any suitable genetic operation may be used. In certain embodiments, a standard genetic operation such as Roulette Wheel selection and one-point crossover may be used.

Returning to the functional block diagram illustrated in FIG. 3, at block 306 quantization of the cluster centers may be performed. In certain embodiments, scalar quantization may be used for the quantization. In certain embodiments, the scalar quantizer for scalar quantization of the cluster centers and basis vectors may be a uniform quantizer, an optimal quantizer (e.g., the Lloy Quantizer), a differential pulse code modulation (DPCM) quantizer, or any other suitable type of quantizer.

At block 308, the cluster membership of each of the one or more clusters may be losslessly coded. Each of the one or more clusters into which the n-dimensional data is partitioned (i.e., at block 302) may include one or more cluster members. As described above, the cluster membership for a cluster may include an index of the one or more cluster members of the cluster. The index may be a list identifying the cluster members of the cluster, such as a set of integers (i.e., the indices of the data points that are the cluster members). The use of a lossless coding may be considered high quality or lossless compression.

Subspace Projection for Compression of Cluster Members

At block 310, a subspace projection technique may be performed for the cluster members of each of the one or more clusters. Each cluster member may be defined by an associated point in the n-dimensional space. In certain embodiments, in order to compress an individual point of a cluster member within a cluster, the point may be projected onto a subspace, resulting in a representation of the point. The projected point may have associated projection coefficients. The projection coefficients of the point may then be compressed.

In certain embodiments, this compression technique may reduce the dimensionality of the data to be compressed, which may provide a high compression ratio with good quality. Mathematically, the subspace projection technique may be described in the following manner.

Let S=span $\{v_i, i=1, 2, \ldots k\}$. The vectors $v_i$ may be orthonormal vectors. Let the function $P_s:R^n \rightarrow S$ be a projection operator. By the orthogonal projection theory, the projection of a point x (e.g., the point defining a cluster member) onto S may be given by the following formula:

$$P_s(x) = \sum_{i=1}^{k} \alpha_i v_i \text{ with } \alpha_i = \langle x, v_i \rangle,$$

where $\langle x, v_i \rangle$ denotes the inner product of x and $v_i$. The subspace projection technique may use the projection $P_s(x)$ as an estimate of the point x, namely:

$$\hat{x} = P_s(x)$$

Since $P_s(x)$ may be determined by the basis $\{v_i\}_{i=1}^{k}$, defining the subspace and selecting the basis may be an important issue with the subspace projection technique. In certain embodiments, the subspace projection technique may include one or more of the following techniques.

A first example subspace projection technique may include, for each of the one or more clusters, determining k−1 fixed vectors generated from linearly independent polynomial vectors, k being less than n, and determining a cluster-varying vector from the cluster center $c_j$. An orthonormal set of one or more basis vectors may be generated from the k linearly independent vectors. In certain embodiments, the Gram-Schmidt algorithm may be used to generate the orthonormal set of basis vectors from the k linearly independent vectors. For each cluster member of the cluster, k projection coefficients may be generated. Thus, in certain embodiments, rather than compressing n coefficients for each cluster member point, k projection coefficients may be compressed. In certain embodiments, for each determined cluster of n-dimensional data 300, the cluster center and the compressed projection coefficients of each cluster member will be transmitted to node 12b, since the fixed basis vectors are known at both the transmitting side (node 12a) and the receiving side (node 12b).

A second example subspace projection technique may include, for each of the one or more clusters generating, using a random projection technique, m independent vectors from the cluster members of the cluster. In certain embodiments, k vectors may be selected as basis vectors using a voting scheme based on geometric closeness, k being less than m. For example, a voting scheme based on geometric closeness may be used to select the k highest voted vectors as basis vectors, where k<m. An orthonormal set of one or more basis vectors may be generated from the k linearly independent vectors. In certain embodiments, the Gram-Schmidt algorithm may be used to generate the orthonormal set of basis vectors from the k linearly independent vectors. For each cluster member of the cluster, k projection coefficients may be generated. In certain embodiments, the k independent basis vectors and projection coefficients will be transmitted to node 12b. This second example subspace projection technique may use more bits to compress n-dimensional data 300, but in certain embodiments it may provide better estimated values for each cluster member point. For example, since the data is produced to represent the distribution of the data points, the representation of the data with this basis vector set may be more accurate than one constructed of a standard basis set (e.g., the first example subspace projection technique described above).

In general, k, the number of dimensions of the subspace, is smaller than the n dimensions of the point x for the cluster member, that is k<<n. In other words, the subspace projection technique may provide a significant reduction in the dimensionality of data to be compressed. At the decoder (i.e., codec 22b of node 12b), the point of the cluster member may be reconstructed from quantized (e.g., quantized using tree-structured quantization) projection coefficients and the basis vectors of the point. This may be performed using the following function:

$$\hat{x} = \sum_{i=1}^{k} \alpha_i^q v_i,$$

where the projection coefficient $\alpha_i^q$ is a quantized coefficient.

Data Quantization

As shown at block 312, the projection coefficients generated at block 310 may be quantized. In certain embodiments, the projection coefficients are quantized using tree-structured vector quantization.

Entropy Coding

In certain embodiments, as shown at block 314, the compressed quantized data may be encoded. For example, entropy coding may be applied to the compressed quantized data. This encoding may format the compressed quantized data for transmission over link 14. In certain embodiments, in order to convert quantized data into a binary format, entropy coding may be used to obtain compressed binary data from quantized data. Example techniques for entropy coding include Huffman coding and algorithmic coding. Since cluster membership must be completely recovered at the decoder side, it is encoded only using entropy coding. In certain embodiments, output data 316 of the entropy coding (block 314) comprises binary code.

Although this invention has been described in terms of certain embodiments and generally associated methods, alterations and permutations of these embodiments and methods will be apparent to those skilled in the art. Accordingly, the above description of example embodiments does not define or constrain this invention. Other changes, substitutions, and alterations are also possible without departing from the spirit and scope of this invention.

What is claimed is:

1. A method for compressing n-dimensional data, comprising: applying, by one or more processing modules, a data clustering algorithm to n-dimensional data to partition the n-dimensional data into one or more clusters, each of the one or more clusters comprising: a cluster center; and a cluster membership that comprises an index of one or more cluster members of the cluster; performing, by the one or more processing modules, for each of the one or more clusters, a subspace projection technique to generate, for each of the cluster members of the cluster, one or more projection coefficients for the cluster member; and performing, on the projection coefficients generated by the subspace projection technique, a tree-structured vector quantization; wherein resulting compressed n-dimensional data comprises, for each of the one or more clusters, a quantized cluster center for the cluster, one or more basis vectors for the cluster, and projection coefficients for the cluster, and wherein the n-dimensional data comprises an n-dimensional graph that comprises a plurality of points, each dimension corresponding to an attribute of an event in a network, the method further comprising determining an optimum number of clusters in which to partition the n-dimensional data by processing the n-dimensional data using a genetic algorithm, the genetic algorithm providing an indicator of an optimal number of clusters, the indicator of the optimal number of clusters being an input to the data clustering algorithm.

2. The method of claim 1, wherein the compressed n-dimensional data comprises, for each of the one or more clusters: a quantized cluster center for the cluster; a losslessly coded cluster membership for the cluster; one or more basis vectors for the cluster; and one or more projection coefficients for each cluster member of the cluster.

3. The method of claim 1, wherein the data clustering algorithm comprises a Fuzzy C-Mean algorithm.

4. The method of claim 1, comprising performing, for each of the one or more clusters, scalar quantization of the cluster center of the cluster.

5. The method of claim 1, wherein performing the subspace projection comprises, for each of the one or more clusters: determining k−1 fixed vectors generated from linearly independent polynomial vectors, k being less than n, determining a cluster-varying vector from the cluster center; generating an orthonormal set of one or more basis vectors from the k linearly independent vectors; and generating, for each cluster member of the cluster, k projection coefficients.

6. The method of claim 1, wherein performing the subspace projection comprises, for each of the one or more clusters: generating, using a random projection technique, m independent vectors from the cluster members of the cluster; selecting k vectors as basis vectors using a voting scheme based on geometric closeness, k being less than m, the k vectors being linearly independent; generating an orthonormal set of one or more basis vectors from the k linearly independent vectors; and generating, for each cluster member of the cluster, k projection coefficients.

7. The method of claim 1, wherein the n-dimensional data comprises intrusion detection data.

8. A method for compressing n-dimensional data, comprising: applying, by one or more processing modules, a data clustering algorithm to n-dimensional data to partition the n-dimensional data into one or more clusters, each of the one or more clusters comprising: a cluster center; and a cluster membership that comprises an index of one or more cluster members of the cluster;

performing, by the one or more processing modules, for each of the one or more clusters, a subspace projection technique to generate, for each of the cluster members of the cluster, one or more projection coefficients for the cluster member; and performing, on the projection coefficients generated by the subspace projection technique, a tree-structured vector quantization;

wherein resulting compressed n-dimensional data comprises, for each of the one or more clusters, a quantized cluster center for the cluster, one or more basis vectors for the cluster, and projection coefficients for the cluster, and wherein the n-dimensional data comprises an n-dimensional graph that comprises a plurality of points, each dimension corresponding to an attribute of an event in a network, wherein: the method is performed by a node in a network; and the method further comprises performing entropy coding of the compressed n-dimensional data to generate binary code for communicating the compressed n-dimensional data over a network to one or more other nodes.

9. A system for compressing n-dimensional data, the system comprising: one or more memory elements; and one or more microprocessors operable to: apply a data clustering algorithm to n-dimensional data to partition the n-dimensional data into one or more clusters, each of the one or more clusters comprising:

a cluster center; and a cluster membership that comprises an index of one or more cluster members of the cluster;

perform, for each of the one or more clusters, a subspace projection technique to generate, for each of the cluster members of the cluster, one or more projection coefficients for the cluster member; and perform on the projection coefficients generated by the subspace projection technique, a tree-structured vector quantization;

wherein resulting compressed n-dimensional data is stored in the memory element and comprises, for each of the one or more clusters, a quantized cluster center for the cluster, one or more basis vectors for the cluster, and projection coefficients for the cluster, and wherein the n-dimensional data comprises an n-dimensional graph that comprises a plurality of points, each dimension corresponding to an attribute of an event in a network, and wherein the one or more microprocessors are operable to determine an optimum number of clusters in which to partition the n-dimensional data by processing the n-dimensional data using a genetic algorithm, the genetic algorithm providing an indicator of an optimal number of clusters, the indicator of the optimal number of clusters being an input to the data clustering algorithm.

10. The system of claim 9, wherein the compressed n-dimensional data comprises, for each of the one or more clusters: a quantized cluster center for the cluster; a losslessly coded cluster membership for the cluster; a basis vector for the cluster; and one or more projection coefficients for each cluster member of the cluster.

11. The system of claim 9, wherein the one or more microprocessors are operable to perform the subspace projection by, for each of the one or more clusters: determining k−1 fixed vectors generated from linearly independent polynomial vectors, k being less than n, determining a cluster-varying vector from the cluster center; generating an orthonormal set of one or more basis vectors from the k linearly independent vectors; and generating, for each cluster member of the cluster, k projection coefficients.

12. The system of claim 9, wherein the one or more microprocessors are operable to perform the subspace projection by, for each of the one or more clusters: generating, using a random projection technique, m independent vectors from the cluster members of the cluster; selecting k vectors as basis vectors using a voting scheme based on geometric closeness, k being less than m, the k vectors being linearly independent; generating an orthonormal set of one or more basis vectors from the k linearly independent vectors; and generating, for each cluster member of the cluster, k projection coefficients.

13. The system of claim 9, wherein the n-dimensional data comprises intrusion detection data.

14. A system for compressing n-dimensional data, the system comprising: one or more memory elements; and one or more microprocessors operable to: apply a data clustering algorithm to n-dimensional data to partition the n-dimensional data into one or more clusters, each of the one or more clusters comprising: a cluster center; and a cluster membership that comprises an index of one or more cluster members of the cluster;

perform, for each of the one or more clusters, a subspace projection technique to generate, for each of the cluster members of the cluster, one or more projection coefficients for the cluster member; and perform on the projection coefficients generated by the subspace projection technique a tree-structured vector quantization;

wherein resulting compressed n-dimensional data is stored in the memory element and comprises, for each of the one or more clusters, a quantized cluster center for the cluster, one or more basis vectors for the cluster, and projection coefficients for the cluster, and wherein the n-dimensional data comprises an n-dimensional graph that comprises a plurality of points, each dimension corresponding to an attribute of an event in a network, wherein the system is a node in a network; and the one or more microprocessors are further operable to perform entropy coding of the compressed n-dimensional data to generate binary code for communicating the compressed n-dimensional data over a network to one or more other nodes.

15. A non-transitory computer-readable medium comprising logic for compressing n-dimensional data, the logic when executed by one or more processing modules operable to: apply a data clustering algorithm to n-dimensional data to partition the n-dimensional data into one or more clusters, each of the one or more clusters comprising:

a cluster center; and a cluster membership that comprises an index of one or more cluster members of the cluster;

perform, for each of the one or more clusters, a subspace projection technique to generate, for each of the cluster members of the cluster, one or more projection coefficients for the cluster member; and perform, on the projection coefficients generated by the subspace projection technique, a tree-structured vector quantization;

wherein resulting compressed n-dimensional data comprises, for each of the one or more clusters, a quantized cluster center for the cluster, one or more basis vectors for the cluster, and projection coefficients for the cluster, wherein the n-dimensional data comprises an n-dimensional graph that comprises a plurality of points, each dimension corresponding to an attribute of an event in a network, and wherein performing the subspace projection comprises, for each of the one or more clusters:

determining k−1 fixed vectors generated from linearly independent polynomial vectors, k being less than n, determining a cluster-varying vector from the cluster center;

generating an orthonormal set of one or more basis vectors from the k linearly independent vectors; and generating, for each cluster member of the cluster, k projection coefficients.

16. A non-transitory computer-readable medium comprising logic for compressing n-dimensional data, the logic when executed by one or more processing modules operable to:

apply a data clustering algorithm to n-dimensional data to partition the n-dimensional data into one or more clusters, each of the one or more clusters comprising:

a cluster center; and a cluster membership that comprises an index of one or more cluster members of the cluster;

perform, for each of the one or more clusters, a subspace projection technique to generate, for each of the cluster members of the cluster, one or more projection coefficients for the cluster member; and perform, on the projection coefficients generated by the subspace projection technique, a tree-structured vector quantization;

wherein resulting compressed n-dimensional data comprises, for each of the one or more clusters, a quantized cluster center for the cluster, one or more basis vectors for the cluster, and projection coefficients for the cluster, wherein the n-dimensional data comprises an n-dimensional graph that comprises a plurality of points, each dimension corresponding to an attribute of an event in a network, and wherein performing the subspace projection comprises, for each of the one or more clusters:

generating, using a random projection technique, m independent vectors from the cluster members of the cluster;

selecting k vectors as basis vectors using a voting scheme based on geometric closeness, k being less than m, the k vectors being linearly independent;

generating an orthonormal set of one or more basis vectors from the k linearly independent vectors; and generating, for each cluster member of the cluster, k projection coefficients.

\* \* \* \* \*

UNITED STATES PATENT AND TRADEMARK OFFICE
CERTIFICATE OF CORRECTION

PATENT NO. : 8,811,156 B1
APPLICATION NO. : 11/559786
DATED : August 19, 2014
INVENTOR(S) : Jiang et al.

It is certified that error appears in the above-identified patent and that said Letters Patent is hereby corrected as shown below:

In the Claims

In column 15, line 16, in Claim 9, after "perform", insert --,--, therefor

In column 16, line 8, in Claim 14, after "perform", insert --,--, therefor

Signed and Sealed this
Eleventh Day of November, 2014

Michelle K. Lee
*Deputy Director of the United States Patent and Trademark Office*